US012744091B2

(12) United States Patent
Hwang et al.

(10) Patent No.: US 12,744,091 B2
(45) Date of Patent: Sep. 22, 2026

(54) NON-VOLATILE READ REFRESH OPERATION COMPRISING DISCHARGING A PLURALITY OF WORD LINES

(71) Applicant: SK hynix Inc., Gyeonggi-do (KR)

(72) Inventors: Sung Hyun Hwang, Gyeonggi-do (KR); Jae Hyeon Shin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 521 days.

(21) Appl. No.: 17/465,619

(22) Filed: Sep. 2, 2021

(65) Prior Publication Data

US 2022/0328106 A1 Oct. 13, 2022

(30) Foreign Application Priority Data

Apr. 7, 2021 (KR) ........................ 10-2021-0045115

(51) Int. Cl.

| | |
|---|---|
| ***G11C 16/26*** | (2006.01) |
| ***G11C 16/04*** | (2006.01) |
| ***G11C 16/08*** | (2006.01) |
| ***G11C 16/24*** | (2006.01) |
| ***G11C 16/30*** | (2006.01) |
| ***G11C 16/32*** | (2006.01) |

(52) U.S. Cl.

CPC .......... *G11C 16/26* (2013.01); *G11C 16/0433* (2013.01); *G11C 16/08* (2013.01); *G11C 16/24* (2013.01); *G11C 16/30* (2013.01); *G11C 16/32* (2013.01)

(58) Field of Classification Search

CPC ...................................................... G11C 16/26
USPC .................................................. 365/189.011
See application file for complete search history.

(56) References Cited

U.S. PATENT DOCUMENTS

| | | | | |
|---|---|---|---|---|
| 8,031,530 | B2 * | 10/2011 | Joo | G11C 16/26 365/185.25 |
| 10,387,340 | B1 * | 8/2019 | Baryudin | G06F 3/0616 |
| 10,521,287 | B2 | 12/2019 | Khoueir et al. | |
| 10,629,272 | B1 * | 4/2020 | Lu | G11C 16/0483 |
| 10,726,891 | B1 * | 7/2020 | Prakash | G11C 11/06057 |
| 2016/0189786 | A1 | 6/2016 | Sakai et al. | |

(Continued)

FOREIGN PATENT DOCUMENTS

| | | |
|---|---|---|
| CN | 110491427 A | 11/2019 |
| KR | 1020170130788 A | 11/2017 |

OTHER PUBLICATIONS

Office Action for Korean Patent Application No. 10-2021-0045115 issued by the Korean Patent Office on Dec. 12, 2024.

*Primary Examiner* — Anthan Tran
(74) *Attorney, Agent, or Firm* — IP&T GROUP LLP

(57) ABSTRACT

A memory system includes: a nonvolatile memory device including a plurality of memory blocks each including a plurality of memory cells coupled to a plurality of word lines; and a controller configured to control the nonvolatile memory device to perform a read operation on the plurality of memory blocks, wherein the read operation includes: a first operation of supplying a first voltage level to the plurality of word lines, a second operation of discharging the plurality of word lines to a second voltage level, a third operation of supplying a third voltage level less than the first voltage level to the plurality of word lines, and a fourth operation of discharging the plurality of word lines to a fourth voltage level.

13 Claims, 8 Drawing Sheets

(56) References Cited

U.S. PATENT DOCUMENTS

| | | | |
|---|---|---|---|
| 2016/0225439 | A1 | 8/2016 | Kim |
| 2020/0258558 | A1 | 8/2020 | Prakash et al. |

* cited by examiner

NON-VOLATILE READ REFRESH OPERATION COMPRISING DISCHARGING A PLURALITY OF WORD LINES

CROSS-REFERENCE TO RELATED APPLICATION

This application claims priority under 35 U.S.C. § 119 to Korean Patent Application No. 10-2021-0045115 filed on Apr. 7, 2021, which is incorporated herein by reference in its entirety.

BACKGROUND

1. Field

Various embodiments of the present disclosure relate to a semiconductor design technology, and specifically, to a nonvolatile memory device that supports a read refresh operation, an operating method of the nonvolatile memory device, and a memory system including the nonvolatile memory device.

2. Discussion of the Related Art

Memory systems are storage devices embodied using a semiconductor such as silicon (Si), germanium (Ge), gallium arsenide (GaAs), indium phosphide (InP), or the like. The memory systems are classified into a volatile memory device and a nonvolatile memory device. The volatile memory device is a memory device in which data stored therein is lost when a power supply is interrupted. Representative examples of the volatile memory device include static RAM (SRAM), dynamic RAM (DRAM), synchronous DRAM (SDRAM), etc. The nonvolatile memory device is a memory device in which data stored therein is retained even when a power supply is interrupted. Representative examples of the nonvolatile memory device include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. Flash memories are chiefly classified into a NOR-type memory and NAND-type memory.

Recently, a computer environment paradigm has shifted to ubiquitous computing, which enables a computer system to be accessed anytime and everywhere. As a result, the use of portable electronic devices such as mobile phones, digital cameras, notebook computers and the like has increased. Such portable electronic devices typically use or include a memory system that uses or embeds at least one memory device, i.e., a data storage device. The data storage device can be used as a main storage device or an auxiliary storage device of a portable electronic device.

In a computing device, unlike a hard disk, a data storage device implemented as a nonvolatile semiconductor memory device is advantageous in that it has excellent stability and durability because it has no mechanical driving part (e.g., a mechanical arm), and has high data access speed and low power consumption. Examples of such a data storage device include a universal serial bus (USB) memory device, a memory card having various interfaces, and a solid state drive (SSD).

SUMMARY

Various embodiments of the present disclosure are directed to providing a nonvolatile memory device capable of effectively performing a read refresh operation, an operating method of the nonvolatile memory device, and a memory system including the nonvolatile memory device.

Technical problems to be achieved in the present disclosure are not limited to the aforementioned technical problems and other unmentioned technical problems will be clearly understood by those skilled in the art in the technical field, to which the present disclosure pertains, from the following description.

In accordance with an embodiment of the present invention, a memory system may include: a nonvolatile memory device including a plurality of memory blocks each including a plurality of memory cells coupled to a plurality of word lines; and a controller configured to control the nonvolatile memory device to perform a read operation on the plurality of memory blocks. The read operation may include: a first operation of supplying a first voltage level to the plurality of word lines, a second operation of discharging the plurality of word lines to a second voltage level, a third operation of supplying a third voltage level less than the first voltage level to the plurality of word lines, and a fourth operation of discharging the plurality of word lines to a fourth voltage level.

Each of the second voltage level and the fourth voltage level may be a ground voltage level.

The second voltage level may be substantially the same as the third voltage level and the fourth voltage level may be a ground voltage level.

The first voltage level may be a level higher by a set level than a highest level among a plurality of read voltage levels used for the read operation. The third voltage level may be any one of the plurality of read voltage levels.

Each of the plurality of memory blocks may further include a first select line and a second select line, the plurality of word lines being arranged between the first select line and the second select line. The read operation may further include: substantially maintaining the first and second select lines to a turn-on voltage level during the first operation or the third operation, substantially maintaining the first and second select lines to one of the turn-on voltage level and a turn-off voltage level during the second operation, and substantially maintaining the first and second select lines to the turn-off voltage level during the fourth operation.

The controller may be further configured to determine when to start the read operation on the basis of a number of accesses to the plurality of memory blocks.

The controller may be further configured to select, as a target memory block for the read operation, one of the memory blocks based on timings of most recent accesses to the memory blocks.

The plurality of memory blocks may be divided into first and second block groups, within each of which the memory blocks share a bit line. The controller may be further configured to determine: when to start the read operation on a memory block within the first block group on the basis of a number of accesses to the first block group, and when to start the read operation on a memory block within the second block group on the basis of a number of accesses to the second block group.

The controller may be further configured to select, as a target memory block for the read operation, a memory block within the first block group based on timings of most recent accesses to the memory blocks within the first block group. The controller may be further configured to select, as a target memory block for the read operation, a memory block within the second block group based on timings of most recent accesses to the memory blocks within the second block group.

In accordance with an embodiment of the present invention, a nonvolatile memory device may include: a plurality of memory blocks each including a plurality of memory cells coupled to a plurality of word lines; and a control circuit configured to perform a read operation on a selected memory block among the plurality of memory blocks. The read operation may include: a first operation of supplying a first voltage level to the plurality of word lines, a second operation of discharging the plurality of word lines to a second voltage level, a third operation of supplying a third voltage level less than the first voltage level to the plurality of word lines, and a fourth operation of discharging the plurality of word lines to a fourth voltage level.

The second voltage level and the fourth voltage level may be a ground voltage level.

The second voltage level may be substantially the same as the third voltage level and the fourth voltage level may be a ground voltage level.

The first voltage level may be a level higher by a set level than a highest level among a plurality of read voltage levels used for the read operation. The third voltage level may be one of the plurality of read voltage levels.

Each of the plurality of memory blocks may further include a first select line and a second select line, the plurality of word lines being arranged between the first select line and the second select line. The read operation may further include: substantially maintaining the first and second select lines to a turn-on voltage level during the first operation or the third operation, substantially maintaining the first and second select lines to one of the turn-on voltage level and a turn-off voltage level during the second operation, and substantially maintaining the first and second select lines to the turn-off voltage level during the fourth operation.

In accordance with an embodiment of the present invention, an operating method of a nonvolatile memory device including a plurality of memory blocks each including a plurality of memory cells coupled to a plurality of word lines, the operating method may include: selecting at least one of the plurality of memory blocks as a selected memory block; and performing a read operation on the selected memory block. The read operation may include: a first operation of supplying a first voltage level to the plurality of word lines, a second operation of discharging, after the first operation, the plurality of word lines to a second voltage level, a third operation of supplying, after the second operation, a third voltage level less than the first voltage level to the plurality of word lines, and a fourth operation of discharging, after the third operation, the plurality of word lines to a fourth voltage level.

Each of the second voltage level and the fourth voltage level may be a ground voltage level.

The second voltage level may be substantially the same as the third voltage level and the fourth voltage level may be a ground voltage level.

The first voltage level may be a level higher by a predetermined amount than a highest level among a plurality of read voltage levels used for the read operation. The third voltage level may be one of the plurality of read voltage levels.

Each of the plurality of memory blocks may further include a first select line and a second select line, the plurality of word lines being arranged between the first select line and the second select line. The read operation may further include: substantially maintaining the first and second select lines to a turn-on voltage level during the first operation or the third operation, substantially maintaining the first and second select lines to one of the turn-on voltage level and a turn-off voltage level during the second operation, and substantially maintaining the first and second select lines to the turn-off voltage level during the fourth operation.

In accordance with an embodiment of the present invention, an operating method of a nonvolatile memory device, the operating method may include: increasing a level of word lines coupled to a memory block to a first level while increasing a level of select lines coupled to the memory block to a turn-on level; discharging the word lines while decreasing the level of select lines to a turn-off level; increasing the level of word lines to a second level less than the first level while increasing the level of select lines to the turn-on level; and discharging the level of word lines while decreasing the level of select lines to the turn-off level.

In accordance with the present technology, in a nonvolatile memory device that supports a read refresh operation, word lines included in a memory block selected as a target for the read refresh operation can be consecutively driven at two different voltage levels and then discharged.

Consequently, it is possible to minimize an increase in disturbance between memory cells because of negative boosting caused by the read refresh operation.

DETAILED DESCRIPTION

Figure 1:
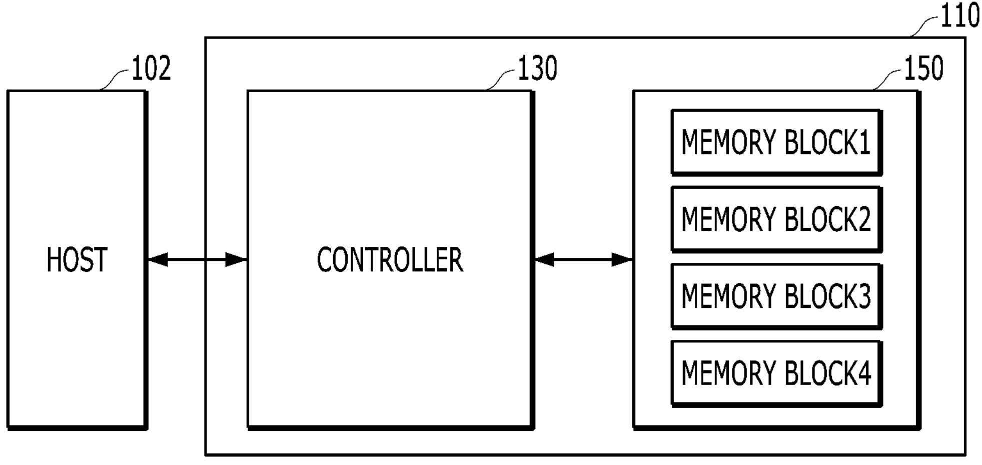
FIG. 1 is a diagram for describing an example of a memory system in accordance with an embodiment of the present disclosure.

Various examples of the present disclosure are described below in more detail with reference to the accompanying drawings. Aspects and features of the present invention, however, may be embodied in different ways to form other embodiments, including variations of any of the disclosed embodiments. Thus, the invention is not limited to the embodiments set forth herein. Rather, the described embodiments are provided so that this disclosure is thorough and complete, and fully conveys the disclosure to those skilled in the art to which the invention pertains. Throughout the disclosure, like reference numerals refer to like parts throughout the various figures and examples of the disclosure. It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without indicating any change in the element itself.

The drawings are not necessarily to scale and, in some instances, proportions may be exaggerated in order to clearly illustrate features of the embodiments. When an element is referred to as being connected or coupled to another element, it should be understood that the former can be directly connected or coupled to the latter, or electrically connected or coupled to the latter via one or more intervening elements therebetween. In addition, it will also be understood that when an element is referred to as being "between" two elements, it may be the only element between the two elements, or one or more intervening elements may also be present.

The terminology used herein is for the purpose of describing particular embodiments only and is not intended to limit the invention. As used herein, singular forms are intended to include the plural forms and vice versa, unless the context clearly indicates otherwise. Similarly, the indefinite articles "a" and "an" mean one or more, unless it is clear from the language or context that only one is intended.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the invention pertains in view of the disclosure. It will be further understood that terms, such as those defined in commonly used dictionaries, should be interpreted as having a meaning that is consistent with their meaning in the context of the disclosure and the relevant art, and not be interpreted in an idealized or overly formal sense unless expressly so defined herein.

In the following description, numerous specific details are set forth in order to provide a thorough understanding of the invention. The invention may be practiced without some or all of these specific details. In other instances, well-known process structures and/or processes have not been described in detail in order not to unnecessarily obscure the invention.

It is also noted, that in some instances, as would be apparent to those skilled in the relevant art, a feature or element described in connection with one embodiment may be used singly or in combination with other features or elements of another embodiment, unless otherwise specifically indicated.

Embodiments of the present disclosure are described in detail below with reference to the accompanying drawings, wherein like numbers reference like elements.

FIG. 1 is a diagram for describing an example of a memory system in accordance with an embodiment of the present disclosure.

Referring to FIG. 1, the data processing system 100 may include a host 102 engaged or operably coupled with the memory system 110.

The host 102 may include any of a portable electronic device, such as a mobile phone, an MP3 player, a laptop computer, or the like, and an electronic device, such as a desktop computer, a game player, a television (TV), a projector, or the like.

The host 102 also includes at least one operating system (OS), which can generally manage and control, functions and operations performed in the host 102. The OS can provide interoperability between the host 102 engaged with the memory system 110 and the user using the memory system 110. The OS may support functions and operations corresponding to a user's requests. By way of example but not limitation, the OS can be classified into a general operating system and a mobile operating system according to mobility of the host 102. The general operating system may be split into a personal operating system and an enterprise operating system according to system requirements or a user's environment. The personal operating system, including Windows and Chrome, may be subject to support services for general purposes. But the enterprise operating systems can be specialized for securing and supporting high performance, including Windows servers, Linux, Unix, and the like. Further, the mobile operating system may include Android, iOS, Windows mobile, and the like. The mobile operating system may be subject to support services or functions for mobility (e.g., a power saving function). The host 102 may include a plurality of operating systems. The host 102 may execute multiple operating systems interlocked with the memory system 110, corresponding to a user's request. The host 102 may transmit a plurality of commands corresponding to the user's requests into the memory system 110, thereby performing operations corresponding to commands within the memory system 110.

The storage devices for the memory system 110 may be implemented with a volatile memory device, for example, a dynamic random access memory (DRAM) and a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM), and a flash memory.

The memory system 110 may include a controller 130 and a memory device 150. The memory device 150 may store data to be accessed by the host 102. The controller 130 may control an operation of storing data in the memory device 150.

The controller 130 and the memory device 150 included in the memory system 110 may be integrated into a single semiconductor device, which may be included in any of the various types of memory systems as discussed above in the examples.

By way of example but not limitation, the controller 130 and memory device 150 may be implemented with an SSD. When the memory system 110 is used as an SSD, the operating speed of the host 102 connected to the memory system 110 can be improved more than that of the host 102 implemented with a hard disk. In addition, the controller 130 and the memory device 150 may be integrated into one semiconductor device to form a memory card, such as a PC card (PCMCIA), a compact flash card (CF), a memory card such as a smart media card (SM, SMC), a memory stick, a multimedia card (MMC, RS-MMC, MMCmicro), a SD card (SD, miniSD, microSD, SDHC), a universal flash memory, or the like.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even when electrical power is not supplied. The memory device 150 may store data provided by the host 102 through a write operation and provide data stored therein to the host 102 through a read operation.

Specifically, the memory device 150 may include a plurality of memory blocks MEMORY BLOCK<1:4>. Each (MEMORY BLOCKi, i is one of 1 to 4) of the memory blocks MEMORY BLOCK<1:4> may include a plurality of memory cells, and include a first select line, a second select line, and a plurality of word lines arranged between the first select line and the second select line. The first select line may be a source select line and the second select line may be a drain select line. For a more detailed configuration of each (MEMORY BLOCKi) of the memory blocks MEMORY BLOCK<1:4> refer to the description of FIG. 3 to be disclosed below.

Due to repetitive access to a specific memory block among the plurality of memory blocks MEMORY BLOCK<1:4> included in the memory device 150, there may occur a disturbance phenomenon in which the threshold voltage of memory cells included in a memory block adjacent to the specific memory block rises. For example, when access to a first memory block MEMORY BLOCK1 among the plurality of memory blocks MEMORY BLOCK<1:4> is repeated, the threshold voltage of memory cells included in each of the second to fourth memory blocks MEMORY BLOCK<2:4> adjacent to the first memory block MEMORY BLOCK1 may rise due to the disturbance phenomenon.

As described above, when the threshold voltage of memory cells included in a specific memory block rises due to the disturbance phenomenon, a read refresh operation may be performed on the specific memory block to lower the threshold voltage of the memory cells. That is, the read refresh operation is an operation that boosts a channel by driving a word line of the specific memory block at a specific level in a state in which a source path of the specific memory block is turned on, and then lowers the potential of the channel by discharging the word line of the specific memory block in a state in which the source path is turned off.

The read refresh operation may be performed on at least one of the plurality of memory blocks MEMORY BLOCK<1:4>. Accordingly, the controller 130 may control the memory device 150 so that the read refresh operation is performed by selecting a block satisfying a set condition among the plurality of memory blocks MEMORY BLOCK<1:4> included in the memory device 150 at a set time point.

At this time, the controller 130 may determine the set time point on the basis of the number of accesses to all of the plurality of memory blocks MEMORY BLOCK<1:4> included in the memory device 150. That is, the controller 130 may determine the 'set time point', which is a time point at which an operation of selecting at least one memory block as a target for the read refresh operation is to be performed, on the basis of the number of accesses to all of the plurality of memory blocks MEMORY BLOCK<1:4>. For example, the controller 130 may determine a time point, at which the number of accesses to all of the plurality of memory blocks MEMORY BLOCK<1:4> included in the memory device 150 exceeds the set number of accesses, as the 'set time point'. When the read refresh operation is performed in response to the number of accesses to all of the plurality of memory blocks MEMORY BLOCK<1:4> exceeding the set number of accesses, the controller 130 may initialize the number of accesses to all of the plurality of memory blocks MEMORY BLOCK<1:4> so that a subsequent read refresh operation is performed.

Furthermore, the controller 130 may classify blocks, in which data are stored among the plurality of memory blocks MEMORY BLOCK<1:4> included in the memory device 150, as storage blocks, and select at least one of the storage blocks, which is selected on the basis of an amount of time lapsed after the most recent access, as a block satisfying a set condition. That is, the controller 130 may determine the 'set condition', which is a condition for selecting at least one memory block as a target for the read refresh operation, on the basis of an amount of time lapsed after the most recent access among the storage blocks in which data are stored. For example, the controller 130 may classify the first to third memory blocks MEMORY BLOCK<1:3> among the plurality of memory blocks MEMORY BLOCK<1:4> as storage blocks, and select the third memory block MEMORY BLOCK3, which is the earliest accessed memory block among the first to third memory blocks MEMORY BLOCK<1:3>, as a block satisfying the 'set condition'.

Furthermore, under the control of the controller 130, the memory device 150 may perform, as the read refresh operation, a first operation of driving at a first voltage level, a plurality of word lines included in the memory block selected as the target for the read refresh operation, a second operation of discharging the plurality of word lines at a second voltage level, a third operation of driving the plurality of word lines at a third voltage level lower than the first voltage level, and a fourth operation of discharging the plurality of word lines at a fourth voltage level.

In accordance with an embodiment, each of the second voltage level and the fourth voltage level may be a ground voltage (VSS) level. In accordance with another embodiment, the second voltage level and the third voltage level may be substantially the same level and the fourth voltage level may be the ground voltage (VSS) level.

In accordance with an embodiment, the first voltage level may be a level higher by a predetermined amount than the highest level among a plurality of read voltage levels used for the read refresh operation on the plurality of memory blocks MEMORY BLOCK<1:4>. Furthermore, the third voltage level may be one of the plurality of read voltage levels.

Furthermore, under the control of the controller 130, the memory device 150 may substantially maintain each of the first select line and the second select line at a turn-on voltage level in a section in which the first operation or the third operation of driving the plurality of word lines included in the memory block selected as the target for the read refresh operation at the first voltage level or the third voltage level is performed. In accordance with an embodiment, the turn-on voltage level may be a level equal to or higher than a power supply voltage level. That is, the turn-on voltage level may be the power supply voltage level, but may also be a pumping voltage level higher than the power supply voltage level.

Furthermore, under the control of the controller 130, the memory device 150 may substantially maintain each of the first select line and the second select line at a turn-off voltage level in a section in which the fourth operation of discharging the plurality of word lines included in the memory block selected as the target for the read refresh operation at the fourth voltage level is performed in the state in which the plurality of word lines have been driven at the third voltage level. In accordance with an embodiment, the turn-off voltage level may be a level equal to or lower than the ground voltage level. That is, the turn-off voltage level may be the ground voltage level, but may also be a negative voltage level lower than the ground voltage level.

Furthermore, under the control of the controller 130, the memory device 150 may substantially maintain each of the first select line and the second select line at one of the turn-on voltage level and the turn-off voltage level in a section in which the second operation of discharging the plurality of word lines included in the memory block selected as the target for the read refresh operation at the second voltage level is performed in the state in which the plurality of word lines have been driven at the first voltage level.

For reference, the purpose of performing the read refresh operation may be to lower again the threshold voltage level of memory cells included in a specific memory block whose threshold voltage level has risen due to the disturbance phenomenon. Accordingly, even though the read refresh operation is performed on the specific memory block, no data may be outputted from the specific memory block. Even though data is outputted, the data may have no meaning.

Figure 2:
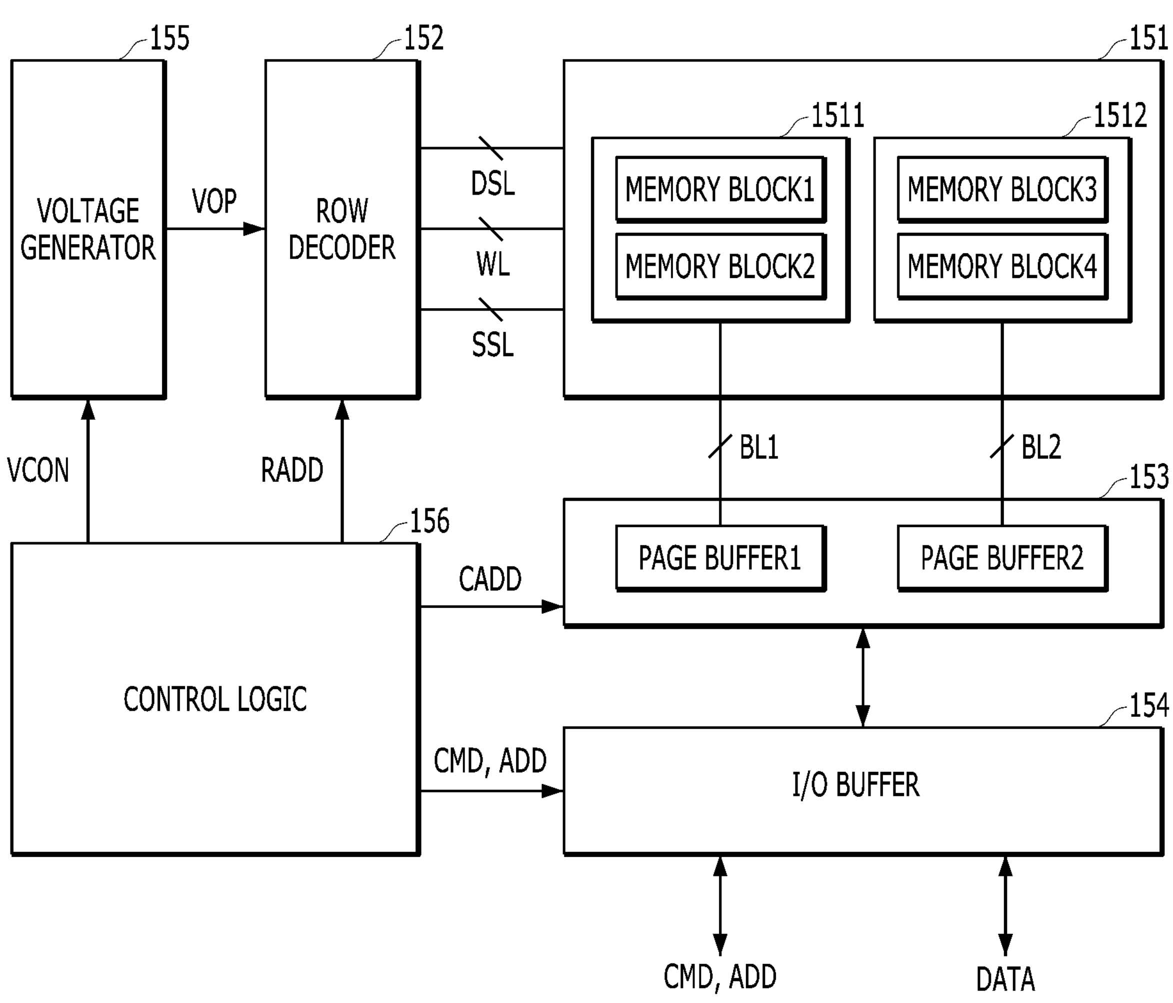
FIG. 2 is a diagram for describing an example of a memory device illustrated in FIG. 1 in accordance with an embodiment of the present disclosure.

FIG. 2 is a diagram for describing an example of the memory device illustrated in FIG. 1 in accordance with an embodiment of the present disclosure.

Referring to FIG. 2, the memory device 150 in accordance with an embodiment of the present disclosure may include a memory cell array 151 in which data are stored. The memory device 150 may include peripheral circuits 152 to 155 configured to perform a program operation for storing data in the memory cell array 151, a read operation for outputting stored data, and an erase operation for erasing stored data. The memory device 150 may include a control logic 156 that controls the peripheral circuits 152 to 155 under the control of the controller (130 of FIG. 1). The peripheral circuits 152 to 155 may include a row decoder 152, a page buffer 153, an input/output (I/O) buffer 154, and a voltage generator 155.

The memory cell array 151 may include the plurality of memory blocks MEMORY BLOCK<1:4>. Local lines and bit line BL1 or BL2 may be connected to each memory block MEMORY BLOCKi (i is one of 1 to 4). For example, the local lines may include at least one source select line SSL, at least one drain select line DSL, and a plurality of word lines WL arranged between the source select line SSL and the drain select line DSL. The local lines may be connected to each (MEMORY BLOCKi) of the memory blocks MEMORY BLOCK<1:4>, and the bit line BL1 or BL2 may be connected in common to at least two of the memory blocks MEMORY BLOCK<1:4>. For example, the first bit line BL1 may be connected in common to the first and second memory blocks MEMORY BLOCK<1:2>, and the second bit line BL2 may be connected in common to the third and fourth memory blocks MEMORY BLOCK<3:4>. The first and second memory blocks MEMORY BLOCK<1:2> sharing the first bit line BL1 may be classified as a first block group 1511, and the third and fourth memory blocks MEMORY BLOCK<3:4> sharing the second bit line BL2 may be classified as a second block group 1512. That is, the first and second memory blocks MEMORY BLOCK<1:2> included in the first block group 1511 may be regarded as being physically adjacent to each other. Likewise, the third and fourth memory blocks MEMORY BLOCK<3:4> included in the second block group 1512 may be regarded as being physically adjacent to each other. On the other hand, the first and second memory blocks MEMORY BLOCK<1:2> included in the first block group 1511 and the third and fourth memory blocks MEMORY BLOCK<3:4> included in the second block group 1512 may be regarded as not being adjacent to each other. For reference, each of the block groups 1511 and 1512 included in the memory device 150 may mean a plane. Furthermore, the fact that two memory blocks are included in one block group 1511 or 1512 is only an example, and actually, a larger number of memory blocks may be included therein. Furthermore, unlike the drawings, all of the plurality of memory blocks MEMORY BLOCK<1:4> included in the memory device 150 may be connected in common to one bit line. That is, as described above with reference to FIG. 1, all of the plurality of memory blocks MEMORY BLOCK<1:4> included in the memory device 150 may be physically adjacent to each other. The memory blocks MEMORY BLOCK<1:4> may be implemented in a two-dimensional or three-dimensional structure. For example, in the memory blocks MEMORY BLOCK<1:4> having a two-dimensional structure, memory cells may be stacked in a direction parallel to a substrate. For example, in the memory blocks MEMORY BLOCK<1:4> having a three-dimensional structure, memory cells may be arranged in a direction intersecting a substrate. A more detailed configuration of each (MEMORY BLOCKi) of the memory blocks MEMORY BLOCK<1:4> will be described in the description of FIG. 3 to be disclosed below.

Due to repetitive access to a specific memory block among the plurality of memory blocks MEMORY BLOCK<1:4> included in the memory device 150, there may occur a disturbance phenomenon in which the threshold voltage of memory cells included in a memory block adjacent to the specific memory block rises.

For example, when access to the first memory block MEMORY BLOCK1 of the first block group 1511 among the plurality of memory blocks MEMORY BLOCK<1:4> is repeated, the threshold voltage of memory cells included in the second memory block MEMORY BLOCK2 included in the first block group 1511 and adjacent to the first memory block MEMORY BLOCK1 may rise due to the disturbance phenomenon. At this time, since the third and fourth memory blocks MEMORY BLOCK<3:4> are included in the second block group 1512 distinguished from the first block group 1511, the threshold voltage of memory cells included therein may not rise.

As another example, when access to the fourth memory block MEMORY BLOCK4 of the second block group 1512 among the plurality of memory blocks MEMORY BLOCK<1:4> is repeated, the threshold voltage of memory cells included in the third memory block MEMORY BLOCK3 included in the second block group 1512 and adjacent to the fourth memory block MEMORY BLOCK4 may rise due to the disturbance phenomenon. At this time, since the first and second memory blocks MEMORY BLOCK<1:2> are included in the first block group 1511 distinguished from the second block group 1512, the threshold voltage of memory cells included therein may not rise.

As described above, when the threshold voltage of memory cells included in a specific memory block rises due to the disturbance phenomenon, the read refresh operation may be performed on the specific memory block to lower the threshold voltage of the memory cells. That is, the read refresh operation is an operation that boosts a channel by driving a word line of the specific memory block at a specific level in a state in which a source path of the specific memory block is turned on, and then lowers the potential of the channel by discharging the word line of the specific memory block in a state in which the source path is turned off.

The read refresh operation may be performed on at least one of the plurality of memory blocks MEMORY BLOCK<1:4>. Accordingly, the controller 130 may control the memory device 150 so that the read refresh operation is performed by selecting a block satisfying the set condition among the plurality of memory blocks MEMORY BLOCK<1:4> included in the memory device 150, at the set time point.

Referring to FIG. 1 and FIG. 2, on the basis of the number of accesses to all of the memory blocks MEMORY BLOCK<1:2> included in the first block group 1511 of the block groups 1511 and 1512 included in the memory device 150, the controller 130 may determine a set time point for the memory blocks MEMORY BLOCK<1:2> included in the first block group 1511 as a first time point. Furthermore, on the basis of the number of accesses to all of the memory blocks MEMORY BLOCK<3:4> included in the second block group 1512 of the block groups 1511 and 1512 included in the memory device 150, the controller 130 may determine a set time point for the memory blocks MEMORY BLOCK<3:4> included in the second block group 1512 as a second time point.

That is, the controller 130 may independently determine the 'set time point', which is a time point at which an operation of selecting at least one memory block as a target for the read refresh operation is to be performed, for the first block group 1511 and the second block group 1512. That is, on the basis of the number of accesses to all of the first and second memory blocks MEMORY BLOCK<1:2> included in the first block group 1511, the controller 130 may determine the set time point for the memory blocks MEMORY BLOCK<1:2> included in the first block group 1511 as the first time point. Likewise, on the basis of the number of accesses to all of the third and fourth memory blocks MEMORY BLOCK<3:4> included in the second block group 1512, the controller 130 may determine the set time point for the memory blocks MEMORY BLOCK<3:4> included in the second block group 1512 as the second time point.

For example, the controller 130 may determine a time point, at which the number of accesses to all of the first and second memory blocks MEMORY BLOCK<1:2> included in the first block group 1511 exceeds the first set number of accesses, as a first time point which is a 'set time point' for the first block group 1511. When the read refresh operation is performed in response to the number of accesses to all of the first and second memory blocks MEMORY BLOCK<1:2> included in the first block group 1511 exceeding the first set number of accesses, the controller 130 may initialize a value of the first set number of accesses so that a subsequent read refresh operation for the first block group 1511 is performed. As another example, the controller 130 may determine a time point, at which the number of accesses to all of the third and fourth memory blocks MEMORY BLOCK<3:4> included in the second block group 1512 exceeds the second set number of accesses, as a second time point which is a 'set time point' for the second block group 1512. When the read refresh operation is performed in response to the number of accesses to all of the third and fourth memory blocks MEMORY BLOCK<3:4> included in the second block group 1512 exceeding the second set number of accesses, the controller 130 may initialize a value of the second set number of accesses so that a subsequent read refresh operation for the second block group 1512 is performed. Here, the first set number of accesses and the second set number of accesses may be substantially the same, but they also may be different from each other.

Furthermore, the controller 130 may classify blocks in which data are stored between the first and second memory blocks MEMORY BLOCK<1:2> included in the first block group 1511, as first storage blocks, and select at least one of the first storage blocks, which is selected on the basis of an amount of time lapsed after the most recent access, as a first target block satisfying the set condition. Furthermore, the controller 130 may classify blocks in which data are stored between the third and fourth memory blocks MEMORY BLOCK<3:4> included in the second block group 1512, as second storage blocks, and select at least one of the second storage blocks, which is selected on the basis of an amount of time lapsed after the most recent access, as a second target block satisfying the set condition.

That is, the controller 130 may independently determine the 'set condition', which is a condition for selecting at least one memory block as a target for the read refresh operation, for the first block group 1511 and the second block group 1512.

For example, data may be stored in each of the first and second memory blocks MEMORY BLOCK<1:2> included in the first block group 1511 and both the first and second memory blocks MEMORY BLOCK<1:2> may be classified as the first storage blocks. The second memory block MEMORY BLOCK2, which is the earliest accessed memory block between the first and second memory blocks MEMORY BLOCK<1:2> classified as the first storage blocks, may be selected as the first target block satisfying the set condition. As another example, data may be stored in each of the third and fourth memory blocks MEMORY BLOCK<3:4> included in the second block group 1512 and both the third and fourth memory blocks MEMORY BLOCK<3:4> may be classified as the second storage blocks. The third memory block MEMORY BLOCK3, which is the earliest accessed memory block between the third and fourth memory blocks MEMORY BLOCK<3:4> classified as the second storage blocks, may be selected as the second target block satisfying the set condition.

Referring back to FIG. 2, the voltage generator 155 may be connected to the row decoder 152 and the control logic 156. The voltage generator 155 may be configured to generate various voltages, which are required for program, read, and erase operations, in response to a voltage control signal VCON of the control logic 156. The voltages generated by the voltage generator 155 may be transferred to the plurality of lines DSL, WL, and SSL, which are connected to the memory cell array 151, through the row decoder 152.

Furthermore, the control logic 156 may be connected to the row decoder 152, the page buffer 153, the I/O buffer 154, and the voltage generator 155. The control logic 156 may output the voltage control signal VCON for generating voltages required for the operation of the memory device 150, in response to a command CMD inputted through the I/O buffer 154. The control logic 156 may output a row address signal RADD and a column address signal CADD in response to an address signal ADD inputted through the I/O buffer 154.

The row decoder 152 may be electrically connected to the memory cell array 151 through the word lines WL and the select lines SSL and DSL. The page buffer 153 may be electrically connected to the memory cell array 151 through the bit line BL1 or BL2. For example, a first page buffer PAGE BUFFER1 included in the page buffer 153 may be electrically connected to the first block group 1511, that is, the first and second memory blocks MEMORY BLOCK<1:2>, through the first bit line BL1. Furthermore, a second page buffer PAGE BUFFER2 included in the page buffer 153 may be electrically connected to the second block group 1512, that is, the third and fourth memory blocks MEMORY BLOCK<3:4>, through the second bit line BL2.

The row decoder 152 may be configured to operate in response to the control of the control logic 156. The row decoder 152 may receive the row address signal RADD from the control logic 156. The row decoder 152 may be configured to decode the received row address signal RADD. The row decoder 152 may select one of the plurality of memory blocks MEMORY BLOCK<1:4> included in the memory cell array 151, in response to the decoded row address signal RADD. The row decoder 152 may transfer various operation voltages VOP generated by the voltage generator 155, for example, voltages used for program, read, and erase operations, to the word lines WL and the select lines SSL and DSL of the selected memory block.

Under the control of the control logic 156, the row decoder 152 and the voltage generator 155 may perform, as the read refresh operation, a first operation of driving the plurality of word lines WL which are included in the selected memory block, at the first voltage level, a second operation of discharging the plurality of word lines WL at the second voltage level, a third operation of driving the plurality of word lines WL at the third voltage level lower than the first voltage level, and a fourth operation of discharging the plurality of word lines WL at the fourth voltage level.

In accordance with an embodiment, each of the second voltage level and the fourth voltage level may be the ground voltage (VSS) level. In accordance with another embodiment, the second voltage level and the third voltage level may be substantially the same level and the fourth voltage level may be the ground voltage (VSS) level.

In accordance with an embodiment, the first voltage level may be a level higher by a predetermined amount than the highest level among a plurality of read voltage levels used for the read refresh operation on the plurality of memory blocks MEMORY BLOCK<1:4>. Furthermore, the third voltage level may be one of the plurality of read voltage levels.

Under the control of the control logic 156, the row decoder 152 and the voltage generator 155 may substantially maintain each of the drain select line DSL and the source select line SSL at the turn-on voltage level in a section in which the first operation or the third operation of driving the plurality of word lines WL which are included in the selected memory block, at the first voltage level or the third voltage level is performed. In accordance with an embodiment, the turn-on voltage level may be a level equal to or higher than the power supply voltage level. That is, the turn-on voltage level may be the power supply voltage level, but may also be the pumping voltage level which is higher than the power supply voltage level.

Under the control of the control logic 156, the row decoder 152 and the voltage generator 155 may substantially maintain each of the drain select line DSL and the source select line SSL at the turn-off voltage level in a section in which the fourth operation of discharging the plurality of word lines WL which are included in the selected memory block, at the fourth voltage level is performed in the state in which the plurality of word lines WL have been driven at the third voltage level. In accordance with an embodiment, the turn-off voltage level may be a level equal to or lower than the ground voltage level. That is, the turn-off voltage level may be the ground voltage level, but may also be the negative voltage level lower than the ground voltage level.

Under the control of the control logic 156, the row decoder 152 and the voltage generator 155 may substantially maintain each of the drain select line DSL and the source select line SSL at one of the turn-on voltage level and the turn-off voltage level in a section in which the second operation of discharging the plurality of word lines WL which are included in the selected memory block, at the second voltage level is performed in the state in which the plurality of word lines WL have been driven at the first voltage level.

The page buffer 153 may operate as a write driver or a sense amplifier according to an operation mode. During the program operation, the page buffer 153 may transfer a voltage corresponding to data to be programmed to the bit line BL1 or BL2 of the memory cell array 151. During the read operation, the page buffer 153 may sense data stored in a selected memory cell through the bit line BL1 or BL2, and transfer the sensed data to the I/O buffer 154. For example, the first page buffer PAGE BUFFER1 included in the page buffer 153 may transfer a voltage corresponding to data to be programmed to the first block group 1511, that is, the first and second memory blocks MEMORY BLOCK<1:2>, through the first bit line BL1, or sense data stored in the first and second memory blocks MEMORY BLOCK<1:2> through the first bit line BL1 and transfer the sensed data to the I/O buffer 154. Furthermore, the second page buffer PAGE BUFFER2 included in the page buffer 153 may transfer a voltage corresponding to data to be programmed to the second block group 1512, that is, the third and fourth memory blocks MEMORY BLOCK<3:4>, through the second bit line BL2, or sense data stored in the third and fourth memory blocks MEMORY BLOCK<3:4> through the second bit line BL2 and transfer the sensed data to the I/O buffer 154. During the erase operation, the page buffer 153 may float the bit line BL1 or BL2 of the memory cell array 151. For example, the first page buffer PAGE BUFFER1 included in the page buffer 153 may float the first bit line BL1 when the erase operation is performed on any block included in the first block group 1511, that is, one of the first and second memory blocks MEMORY BLOCK<1:2>. Furthermore, the second page buffer PAGE BUFFER2 included in the page buffer 153 may float the second bit line BL2 when the erase operation is performed on any block included in the second block group 1512, that is, one of the third and fourth memory blocks MEMORY BLOCK<3:4>.

The I/O buffer 154 may transfer write data, which is inputted from an exterior, to the page buffer 153 during the program operation. The I/O buffer 154 may output data, which is provided from the page buffer 153, to an exterior during the read operation. The I/O buffer 154 may transfer the address signal ADD or the command CMD, which is inputted from an exterior, to the control logic 156.

For reference, the purpose of performing the read refresh operation may be to lower again the threshold voltage level of memory cells included in a specific memory block whose threshold voltage level has risen due to the disturbance phenomenon. Accordingly, even though the read refresh operation is performed on the specific memory block, no data may be stored in the page buffer 153 corresponding to the specific memory block. Even though data are stored in the page buffer 153, no data may be outputted through the I/O buffer 154. Even though data stored in the page buffer 153 are outputted through the I/O buffer 154, the data may have no meaning.

Figure 3:
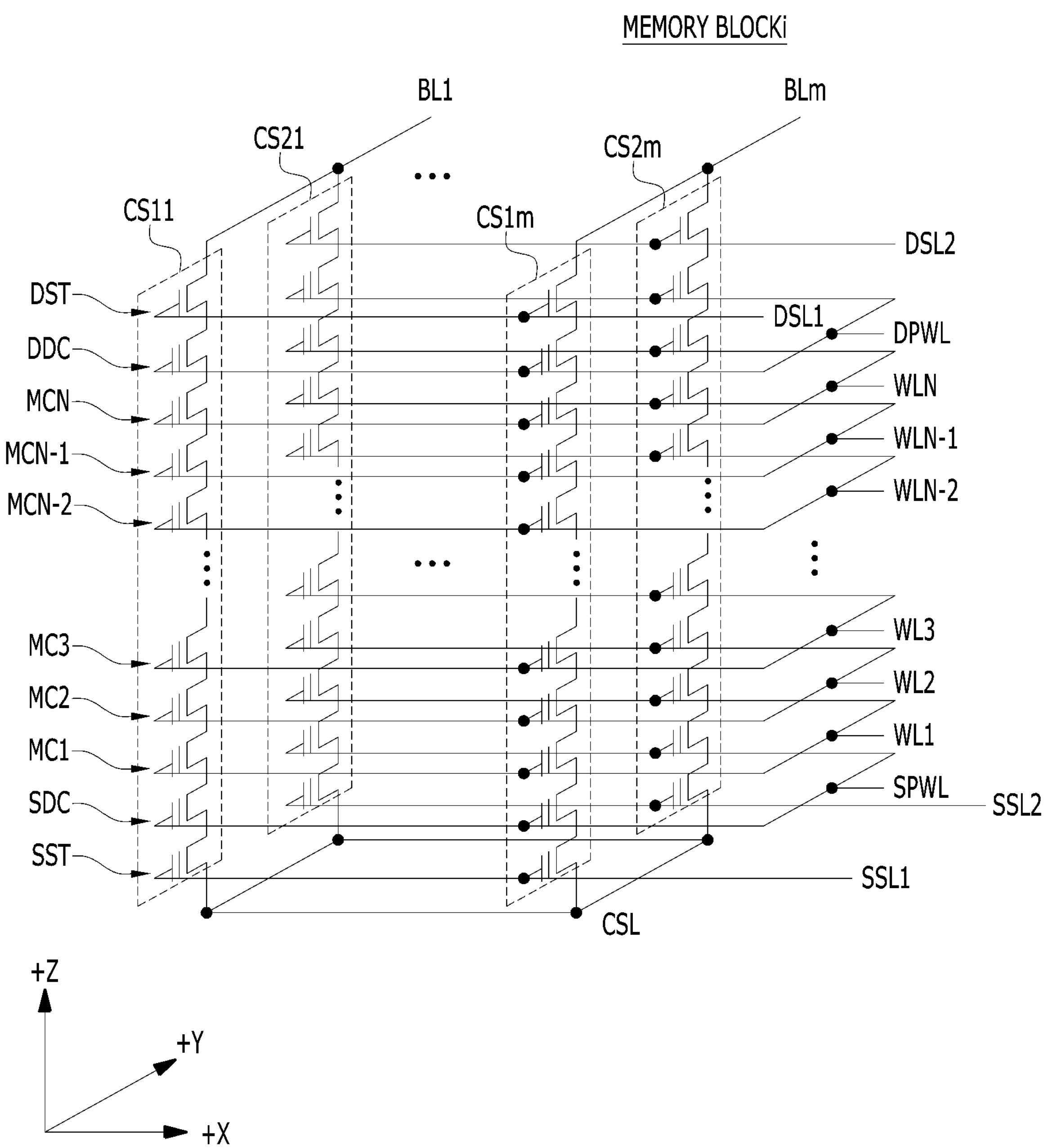
FIG. 3 is a diagram for describing an example of a memory block illustrated in FIG. 1 and FIG. 2 in accordance with an embodiment of the present disclosure.

FIG. 3 is a diagram for describing an example of the memory block illustrated in FIG. 1 and FIG. 2 in accordance with an embodiment of the present disclosure.

Referring to FIG. 3, each of the plurality of memory blocks MEMORY BLOCK<1:4> (MEMORY BLOCKi) illustrated in FIG. 1 and FIG. 2 may include a plurality of cell strings CS11 to CS1*m* and CS21 to CS2*m*. Each of the plurality of cell strings CS11 to CS1*m* and CS21 to CS2*m* may extend along a +Z direction. Each of the plurality of cell strings CS11 to CS1*m* and CS21 to CS2*m* may include at least one source select transistor SST, at least one source-side dummy memory cell SDC, first to $N^{th}$ normal memory cells MC1 to MCN, at least one drain-side dummy memory cell DDC, and at least one drain select transistor DST, which are stacked on a substrate (not illustrated) under the memory block BLKi.

The source select transistor SST of each cell string may be connected between a common source line CSL and the source-side dummy memory cell SDC. Source select transistors of cell strings (for example, CS11 to CS1*m*) arranged in substantially the same row may be connected to substantially the same source select line (for example, SSL1). Source select transistors of the cell strings CS11 to CS1*m* arranged in a first row may be connected to a first source select line SSL1. Source select transistors of the cell strings CS21 to CS2*m* arranged in a second row may be connected to a second source select line SSL2.

The source-side dummy memory cells SDC of each cell string may be connected in series between the source select transistor SST and the normal memory cells MC1 to MCN. The source-side dummy memory cells having substantially the same height may be connected to substantially the same source-side dummy word line. Gates of the source-side dummy memory cells SDC may be connected to a source-side dummy word line SPWL.

The first to $N^{th}$ normal memory cells MC1 to MCN of each cell string may be connected in series between the source-side dummy memory cell SDC and the drain-side dummy memory cell DDC. The gates of the first to $N^{th}$ normal memory cells MC1 to MCN may be connected to first to $N^{th}$ normal word lines WL1 to WLN, respectively.

The drain-side dummy memory cells DDC of each cell string may be connected in series between the drain select transistor DST and the normal memory cells MC1 to MCN. The drain-side dummy memory cells having substantially the same height may be connected to substantially the same source-side dummy word line. The drain-side dummy memory cells DDC may be connected to a drain-side dummy word line DPWL.

The drain select transistor DST of each cell string may be connected between a corresponding bit line and the drain-side dummy memory cell DDC. The drain select transistors of cell strings arranged in a row direction may be connected to drain selection lines extending in the row direction. The drain select transistors of the cell strings CS11 to CS1*m* of the first row may be connected to a first drain selection line DSL1. The drain select transistors of the cell strings CS21 to CS2*m* of the second row may be connected to a second drain selection line DSL2.

Each of the first to $N^{th}$ normal memory cells MC1 to MCN may also store 1-bit data or store 2 or more bits of data. In general, a memory cell that stores 1-bit data may be referred to as a single level cell (SLC), a memory cell that stores 2 or more bits of data may be referred to as a multi-level cell (MLC), a memory cell that stores 3-bit data may be referred to as a triple level cell (TLC), a memory cell that stores 4-bit data may be referred to as a quadruple level cell (QLC), and a memory cell that stores 5 bits or more bits of data may be referred to as a multiple level cell. The single level cell may have an erase state and a program state according to a threshold voltage, and each of the multi-level cell, the triple level cell, the quadruple level cell, and the multiple level cell may have an erase state and a plurality of program states according to a threshold voltage.

Figure 8:
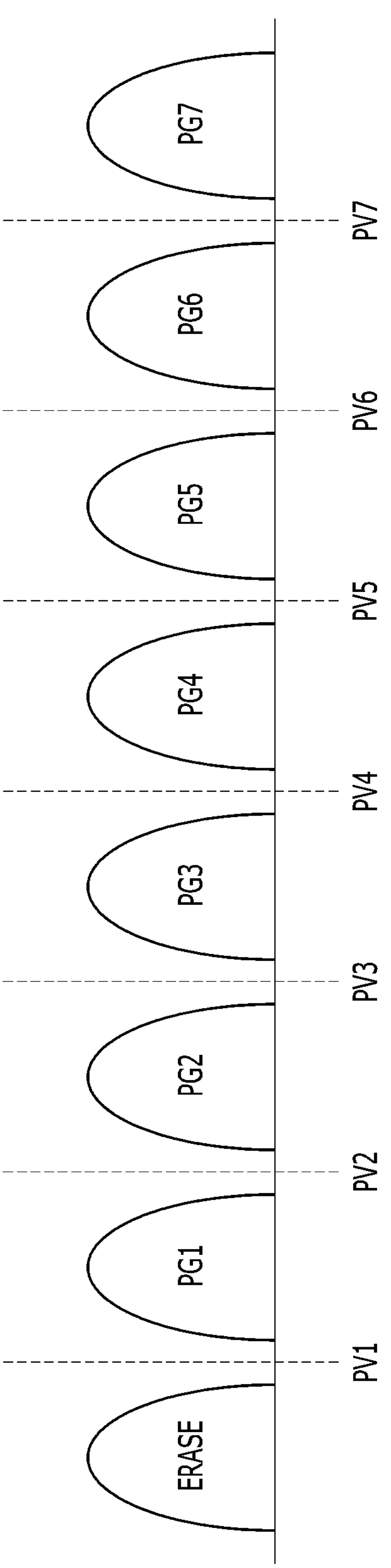
FIG. 8 is a diagram for describing a threshold voltage distribution of a multilevel cell in accordance with an embodiment of the present disclosure.

In an embodiment of the present disclosure, each of the first to $N^{th}$ normal memory cells MC1 to MCN is a triple level cell (TLC) that stores 3-bit data. Accordingly, as illustrated in FIG. 8, each of the first to $N^{th}$ normal memory cells MC1 to MCN may have an erase state ERASE and seven program states PG1 to PG7.

Here, the threshold voltage level of memory cells in the erase state ERASE may be lower than a first voltage PV1 level, the threshold voltage level of memory cells in the first program state PG1 may be higher than the first voltage (PV1) level and lower than a second voltage (PV2) level, the threshold voltage level of memory cells in the second program state PG2 may be higher than the second voltage (PV2) level and lower than a third voltage (PV3) level, the threshold voltage level of memory cells in the third program state PG3 may be higher than the third voltage (PV3) level and lower than a fourth voltage (PV4) level, the threshold voltage level of memory cells in the fourth program state PG4 may be higher than the fourth voltage (PV4) level and lower than a fifth voltage (PV5) level, the threshold voltage level of memory cells in the fifth program state PG5 may be higher than the fifth voltage (PV5) level and lower than a sixth voltage (PV6) level, the threshold voltage level of memory cells in the sixth program state PG6 may be higher than the sixth voltage (PV6) level and lower than a seventh voltage (PV7) level, and the threshold voltage level of memory cells in the seventh program state PG7 may be higher than the seventh voltage (PV7) level. Here, the erase state ERASE and the first to seventh program states PG1 to PG7 indicate states in which data having different values are stored in a memory cell.

Here, the first to seventh voltages PV1 to PV7 may be voltages serving as references for distinguishing whether a memory cell is in the erase state ERASE, the first program state PG1, the second program state PG2, the third program state PG3, the fourth program state PG4, the fifth program state PG5, the sixth program state PG6, or the seventh program state PG7. Accordingly, a sensing operation using the first to seventh voltages PV1 to PV7 may be performed when whether a memory cell has been correctly programmed is verified, or when data stored in a memory cell are read.

Figure 4:
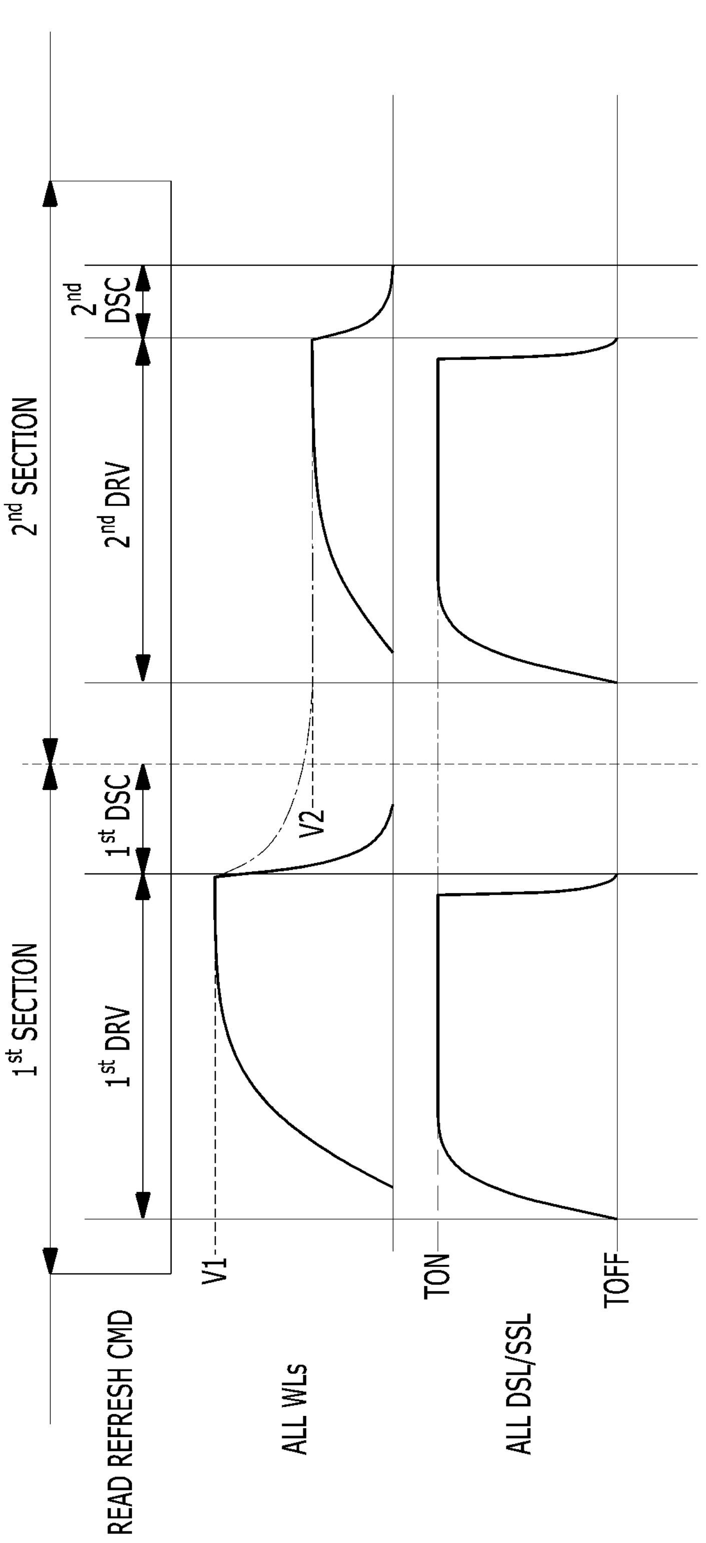
FIG. 4 is a diagram for describing an example of a read refresh operation performed by the memory device in accordance with an embodiment of the present disclosure.

FIG. 4 is a diagram for describing an example of the read refresh operation performed by the memory device in accordance with an embodiment of the present disclosure.

Referring to FIG. 1 to FIG. 4, the read refresh operation in accordance with an embodiment of the present disclosure may be roughly classified into a first section operation $1^{ST}$ SECTION and a second section operation $2^{ND}$ SECTION. That is, when the read refresh operation on a selected memory block is started in response to a read refresh command READ REFRESH CMD, after the first section operation $1^{ST}$ SECTION is performed on the selected memory block, the second section operation $2^{ND}$ SECTION may be performed thereon.

The first section operation $1^{ST}$ SECTION may include a first operation $1^{ST}$ DRV and a second operation $1^{ST}$ DSC. The second section operation $2^{ND}$ SECTION may include a third operation $2^{ND}$ DRV and a fourth operation $2^{ND}$ DSC.

The first operation $1^{ST}$ DRV may include an operation of driving all word lines ALL WLs which are included in a memory block selected as a target for the read refresh operation, at a first voltage level V1. Furthermore, the first operation $1^{ST}$ DRV may include an operation of substantially maintaining all select lines which are included in the memory block selected as the target for the read refresh operation, that is, the drain select lines DSL and the source select lines SSL, at a turn-on voltage level TON.

The second operation $1^{ST}$ DSC may be an operation of discharging all of the word lines ALL WLs, which have been driven at the first voltage level V1 through the first operation $1^{ST}$ DRV, at a second voltage level. Furthermore, the second operation $1^{ST}$ DSC may include an operation of substantially maintaining all of the select lines which are included in the memory block selected as the target for the read refresh operation, that is, the drain select lines DSL and the source select lines SSL, at one of the turn-on voltage level TON and a turn-off voltage level TOFF.

Here, when the second voltage level V2 is set to a relatively low level (solid line) in the second operation $1^{ST}$ DSC, the drain select lines DSL and the source select lines SSL may be substantially maintained at the turn-off voltage level TOFF (solid line) during the section of the second operation $1^{ST}$ DSC. Furthermore, when the second voltage level is set to a relatively high level (dotted line) in the second operation $1^{ST}$ DSC, the drain select lines DSL and the source select lines SSL may be substantially maintained at the turn-on voltage level TON (dotted line) during the section of the second operation $1^{ST}$ DSC.

The third operation $2^{ND}$ DRV may be performed subsequent to the second operation $1^{ST}$ DSC, and may be an operation of driving all of the word lines ALL WLs, which are included in the memory block selected as the target for the read refresh operation, at a third voltage level V2. Furthermore, the third operation $2^{ND}$ DRV may include an operation of substantially maintaining all of the select lines, which are included in the memory block selected as the target for the read refresh operation, that is, the drain select lines DSL and the source select lines SSL, at the turn-on voltage level TON.

The fourth operation $2^{ND}$ DSC may be an operation of discharging all of the word lines ALL WLs which have been driven at the third voltage level V2 through the third operation $2^{ND}$ DRV, at a fourth voltage level. Furthermore, the fourth operation $2^{ND}$ DSC may include an operation of substantially maintaining all the select lines which are included in the memory block selected as the target for the read refresh operation, that is, the drain select lines DSL and the source select lines SSL, at the turn-off voltage level TOFF.

In accordance with an embodiment, the first voltage level V1 may be a level higher by a set level than the highest level among a plurality of read voltage levels used for the read refresh operation on the memory block selected as the target for the read refresh operation. For example, referring to FIG. 8 together, the first voltage level V1 may be a level higher by a set level than the highest level, that is, the seventh voltage (PV7) level among the first to seventh voltage (PV1 to PV7) levels used for the read refresh operation on the triple level cell (TLC) having the erase state ERASE and the seven program states PG1 to PG7. Particularly, the first voltage level V1 may be enough of a voltage level for turning on all memory cells in the seventh program state PG7.

In accordance with an embodiment, the third voltage level V2 may be one of the plurality of read voltage levels used for the read refresh operation on the memory block selected as the target. For example, referring to FIG. 4 and FIG. 8 together, the third voltage level V2 may be one of the first to seventh voltage PV1 to PV7 levels used for the read refresh operation on the triple level cell (TLC) having the erase state ERASE and the seven program states PG1 to PG7. Particularly, the third voltage level V2 may be the fifth voltage (PV5) level for distinguishing the fourth program state PG4 from the fifth program state PG5. That is, the third voltage level V2 may be a level capable of turning on memory cells corresponding to almost half of the program states among the seven program states PG1 to PG7 and turning off memory cells corresponding to the other half.

In accordance with an embodiment, the second voltage level and the fourth voltage level may be the ground voltage (VSS) level as indicated by the solid line in the drawing.

In accordance with an embodiment, the second voltage level may be substantially the same voltage level as the third voltage level V2 as indicated by the dotted line in the drawing.

In accordance with an embodiment, the turn-on voltage level may be a level equal to or higher than the power supply voltage level. That is, the turn-on voltage level may be the power supply voltage level, but may also be the pumping voltage level which is higher than the power supply voltage level.

In accordance with an embodiment, the turn-off voltage level may be a level equal to or lower than the ground voltage level. That is, the turn-off voltage level may be the ground voltage level, but may also be the negative voltage level which is lower than the ground voltage level.

Figure 5:
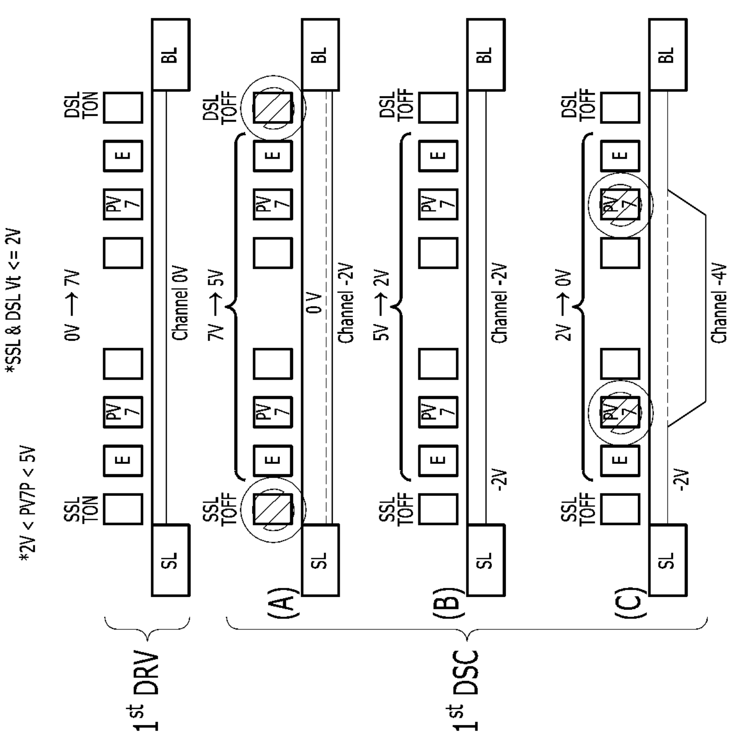
FIG. 5 is a diagram for describing in detail a first section operation of the read refresh operation illustrated in FIG. 4 in accordance with an embodiment of the present disclosure.
Figure 5:
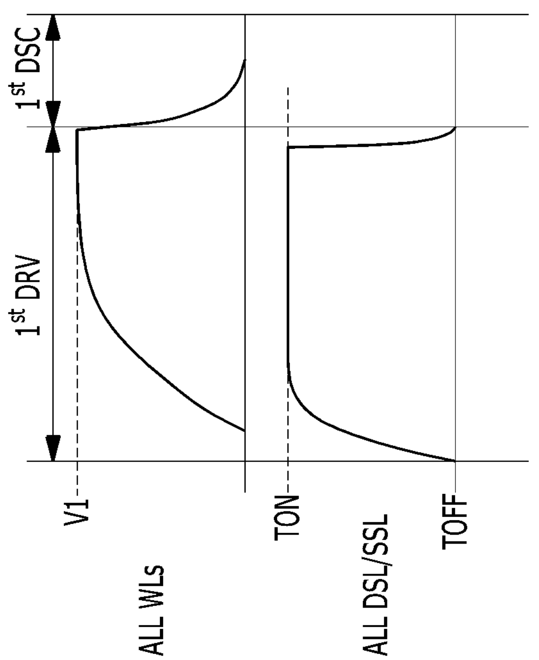

FIG. 5 is a diagram for describing in detail the first section operation of the read refresh operation illustrated in FIG. 4 in accordance with an embodiment of the present disclosure.

Referring to FIG. 1 to FIG. 5, it may be used to understand in detail a phenomenon occurring in the memory block selected as the target for the read refresh operation in the first section operation $1^{ST}$ SECTION of the read refresh operation in accordance with an embodiment of the present disclosure.

First, the seventh voltage (PV7) level, which is the highest level among the first to seventh voltage (PV1 to PV7) levels used to determine the data of the plurality of memory cells MC1 to MCN included in the memory block selected as the target for the read refresh operation, is higher than 2V and lower than 5V. Furthermore, a threshold voltage level DSL Vt of the drain select transistor DST and a threshold voltage level SSL Vt of the source select transistor SST, which are included in the memory block selected as the target for the read refresh operation, are equal to or less than 2V. Furthermore, the first voltage level V1 is 7V higher than the seventh voltage PV7. Furthermore, the second voltage level is the ground voltage (VSS, 0V) level. Furthermore, data in the seventh program state PG7 are stored in both the memory cell MCN closest to the drain select transistor DST and the memory cell MC1 closest to the source select transistor SST among the plurality of memory cells MC1 to MCN included in the memory block selected as the target for the read refresh operation and turn-on/turn-off is selected based on the seventh voltage PV7. Furthermore, the dummy memory cells DDC and SDC existing between the plurality of memory cells MC1 to MCN and the drain select transistor DST/the source select transistor SST are all in an erase state E.

In the first operation $1^{ST}$ DRV of the first section operation $1^{ST}$ SECTION, each of the drain select line DSL and the source select line SSL included in the memory block selected as the target for the read refresh operation is at the turn-on voltage level TON, and the turn-on voltage level TON may be a level higher than 2V. Accordingly, the drain select transistor DST and the source select transistor SST may be in a turned-on state.

In the first operation $1^{ST}$ DRV, the levels of all of the word lines ALL WLs included in the memory block selected as the target for the read refresh operation may rise from the ground voltage (VSS) level to 7V which is the first voltage level V1. At this time, since the levels of all of the word lines ALL WLs are higher than the seventh voltage PV7, all of the memory cells MC1 to MCN included in all the word lines ALL WLs may be in a turned-on state. In this way, the levels of all of the word lines ALL WLs rise, but the drain select transistor DST and the source select transistor SST are in a turned-on state. Thus, a channel may substantially maintain the ground voltage (VSS) level 0V.

In state 'A' of the second operation $1^{ST}$ DSC of the first section operation $1^{ST}$ SECTION, each of the drain select line DSL and the source select line SSL included in the memory block selected as the target for the read refresh operation is at the turn-off voltage level TOFF, and the turn-off voltage level TOFF may be the ground voltage (VSS) level 0V. Accordingly, in the state 'A' of the second operation $1^{ST}$ DSC, the drain select transistor DST and the source select transistor SST may be in a turned-off state.

The state 'A' of the second operation $1^{ST}$ DSC may indicate a time point immediately after the second operation $1^{ST}$ DSC is started after the first operation $1^{ST}$ DRV. Accordingly, in the state 'A' of the second operation $1^{ST}$ DSC, the levels of all of the word lines ALL WLs included in the memory block selected as the target for the read refresh operation may rise to 7V, which is the first voltage level V1, through the first operation $1^{ST}$ DRV, and then fall to 5V as the second operation $1^{ST}$ DSC is started. At this time, since the levels of all of the word lines ALL WLs are higher than the seventh voltage PV7, all of the memory cells MC1 to MCN included in all the word lines ALL WLs may be in a turned-on state. In this way, since both the drain select transistor DST and the source select transistor SST are in a turned-off state in the section in which the levels of all of the word lines ALL WLs fall from 7V to 5V, the voltage level of the channel may fall to −2V lower than the ground voltage (VSS) level 0V.

In state 'B' of the second operation $1^{ST}$ DSC subsequent to the state 'A' of the second operation $1^{ST}$ DSC of the first section operation $1^{ST}$ SECTION, each of the drain select line DSL and the source select line SSL included in the memory block selected as the target for the read refresh operation is at the turn-off voltage level TOFF, and the turn-off voltage level TOFF may be the ground voltage (VSS) level 0V. However, since the voltage level of the channel has fallen to −2V in the state 'A' of the second operation $1^{ST}$ DSC, the drain select transistor DST and the source select transistor SST may be switched to a turned-on state.

The levels of all of the word lines ALL WLs having fallen to 5V in the state 'A' of the second operation $1^{ST}$ DSC may further fall to 2V in the state 'B' of the second operation $1^{ST}$ DSC. In this way, in the process of switching from the state 'A' to the state 'B' of the second operation $1^{ST}$ DSC, some of the memory cells MC1 to MCN included in all of the word lines ALL WLs may be switched from a turned-on state to a turned-off state, but most of the memory cells may substantially maintain a turned-on state. Although the levels of all of the word lines ALL WLs fall from 5V to 2V, both the drain select transistor DST and the source select transistor SST are in a turned-on state. Thus, the channel may continuously maintain the state in which its voltage level has fallen to −2V in the state 'A' of the second operation $1^{ST}$ DSC until the state 'B' of the second operation $1^{ST}$ DSC.

In state 'C' of the second operation $1^{ST}$ DSC subsequent to the state 'B' of the second operation $1^{ST}$ DSC of the first section operation $1^{ST}$ SECTION, each of the drain select line DSL and the source select line SSL included in the memory block selected as the target for the read refresh operation is at the turn-off voltage level TOFF, and the turn-off voltage level TOFF may be the ground voltage (VSS) level 0V. Furthermore, since the voltage level of the channel has fallen to −2V in the state 'A' of the second operation $1^{ST}$ DSC, both the drain select transistor DST and the source select transistor SST may continuously maintain a turned-on state, as in the state 'B' of the second operation $1^{ST}$ DSC.

The levels of all of the word lines ALL WLs having fallen to 2V in the state 'B' of the second operation $1^{ST}$ DSC may further fall to the ground voltage (VSS) level 0V in the state 'C' of the second operation $1^{ST}$ DSC. In this way, in the process of switching from the state 'B' to the state 'C' of the second operation $1^{ST}$ DSC, most of the memory cells MC1 to MCN included in all of the word lines ALL WLs may be in a turned-off state. Particularly, both the memory cell MCN closest to the drain select transistor DST and the memory cell MC1 closest to the source select transistor SST, which are turned on or off based on the seventh voltage PV7 having a larger value than 2V, may be in a turned-off state. In this way, as the memory cell MCN closest to the drain select transistor DST and the memory cell MC1 closest to the source select transistor SST are reliably in a turned-off state in the section in which the levels of all of the word lines ALL WLs fall from 2V to the ground voltage (VSS) level 0V, the voltage level of the channel between the memory cell MCN closest to the drain select transistor DST and the memory cell MC1 closest to the source select transistor SST may fall to −4V which is lower than −2V.

As described above, the point that the threshold voltage of the memory cells MC1 to MCN may appropriately fall through the operation in which the voltage level of the channel falls to −2V in the state 'A' and the state 'B' of the second operation $1^{ST}$ DSC of the first section operation $1^{ST}$ SECTION, coincide with the purpose of the read refresh operation. However, the point that the threshold voltage of the memory cells MC1 to MCN may excessively fall due to the operation in which the voltage level of the channel falls to −4V in the state 'C' of the second operation $1^{ST}$ DSC of the first section operation $1^{ST}$ SECTION, may not coincide with the purpose of the read refresh operation.

Accordingly, in accordance with an embodiment of the present disclosure, by performing the second section operation $2^{ND}$ SECTION, it is possible to compensate for, to some extent, the threshold voltage of the memory cells MC1 to MCN that excessively falls due to the state 'C' of the second operation $1^{ST}$ DSC of the first section operation $1^{ST}$ SECTION.

Figure 6:
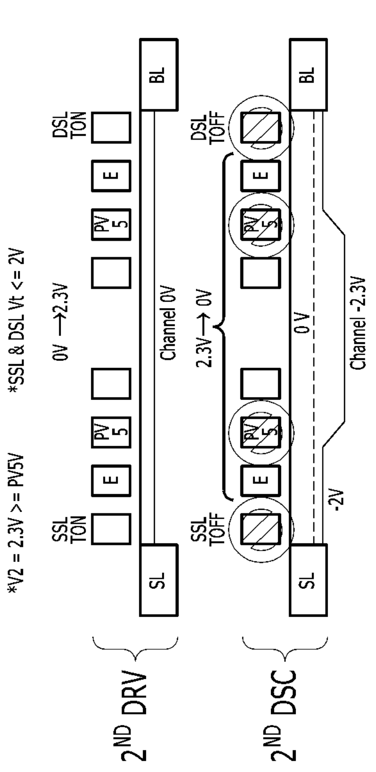
FIG. 6 and FIG. 7 are diagrams for describing in detail a second section operation of the read refresh operation illustrated in FIG. 4 in accordance with an embodiment of the present disclosure.
Figure 6:
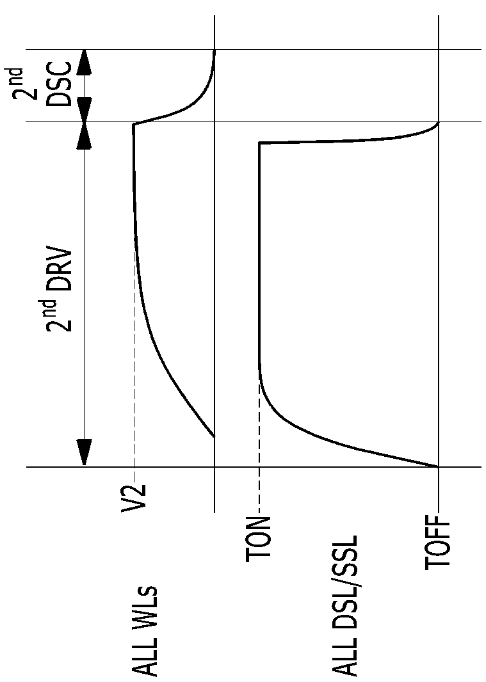
Figure 7:
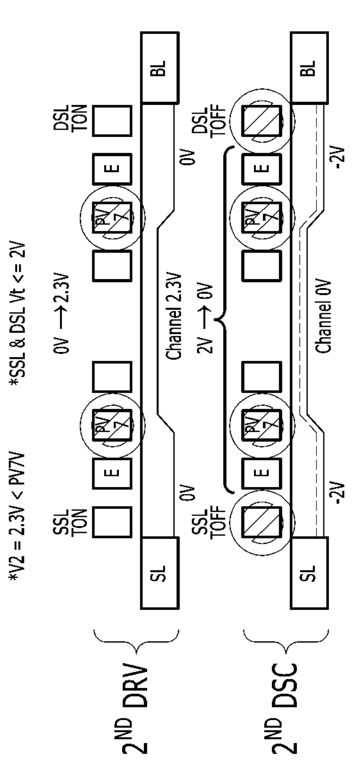
Figure 7:
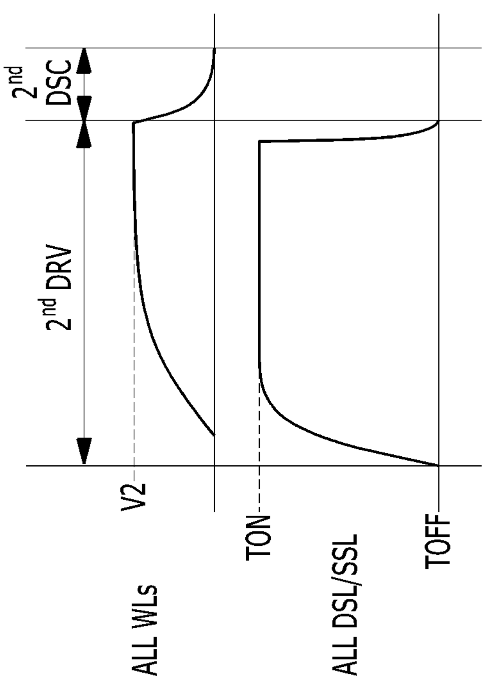

FIG. 6 and FIG. 7 are diagrams for describing in detail the second section operation of the read refresh operation illustrated in FIG. 4 in accordance with an embodiment of the present disclosure.

First, FIG. 6 and FIG. 7 illustrate a phenomenon occurring in the memory block selected as the target for the read refresh operation in the second section operation $2^{ND}$ SECTION of the read refresh operation in accordance with an embodiment of the present disclosure. FIG. 6 illustrates a case where data in the fifth program state PG5 are stored in both the memory cell MCN closest to the drain select transistor DST and the memory cell MC1 closest to the source select transistor SST among the plurality of memory cells MC1 to MCN included in the memory block selected as the target for the read refresh operation and turn-on/turn-off is selected based on the fifth voltage PV5. FIG. 7 illustrates a case where data in the seventh program state PG7 are stored in both the memory cell MCN closest to the drain select transistor DST and the memory cell MC1 closest to the source select transistor SST among the plurality of memory cells MC1 to MCN included in the memory block selected as the target for the read refresh operation and turn-on/turn-off is selected based on the seventh voltage PV7.

Specifically, referring to FIG. 1 to FIG. 6, the level of the fifth voltage PV5 which is close to the middle among the first to seventh voltage (PV1 to PV7) levels used to determine the data of the plurality of memory cells MC1 to MCN included in the memory block selected as the target for the read refresh operation, is lower than or equal to 2.3V. Furthermore, the threshold voltage level DSL Vt of the drain select transistor DST and the threshold voltage level SSL Vt of the source select transistor SST which are included in the memory block selected as the target for the read refresh operation, are equal to or less than 2V. Furthermore, the third voltage level V2 is 2.3V. Furthermore, the dummy memory cells DDC and SDC existing between the plurality of memory cells MC1 to MCN and the drain select transistor DST/the source select transistor SST are all in an erase state E.

In the third operation $2^{ND}$ DRV of the second section operation $2^{ND}$ SECTION, each of the drain select line DSL and the source select line SSL included in the memory block selected as the target for the read refresh operation is at the turn-on voltage level TON, and the turn-on voltage level TON may be a level higher than 2V. Accordingly, the drain select transistor DST and the source select transistor SST may be in a turned-on state.

In the third operation $2^{ND}$ DRV, the levels of all of the word lines ALL WLs included in the memory block selected as the target for the read refresh operation may rise from the ground voltage (VSS) level to 2.3V which is the third voltage level V2. In this way, almost half of the memory cells MC1 to MCN included in all of the word lines ALL WLs may be in a turned-on state in the third operation $2^{ND}$ DRV. Particularly, both the memory cell MCN closest to the drain select transistor DST and the memory cell MC1 closest to the source select transistor SST, which are turned on or off based on the fifth voltage PV5 having a value lower than or equal to 2.3V, may be in a turned-on state. The levels of all of the word lines ALL WLs rise, but the drain select transistor DST and the source select transistor SST are in a turned-on state. Thus, the channel may substantially maintain the ground voltage (VSS) level 0V.

In the fourth operation $2^{ND}$ DSC of the second section operation $2^{ND}$ SECTION, each of the drain select line DSL and the source select line SSL included in the memory block selected as the target for the read refresh operation is at the turn-off voltage level TOFF, and the turn-off voltage level TOFF may be the ground voltage (VSS) level 0V. Accordingly, in the fourth operation $2^{ND}$ DSC, the drain select transistor DST and the source select transistor SST may be in a turned-off state.

The levels of all of the word lines ALL WLs having risen to 2.3V which is the third voltage level V2 in the third operation $2^{ND}$ DRV may fall to the ground voltage (VSS) level 0V in the fourth operation $2^{ND}$ DSC.

In this way, in the process in which the fourth operation $2^{ND}$ DSC is performed after the third operation $2^{ND}$ DRV, most of the memory cells MC1 to MCN included in all of the word lines ALL WLs may be in a turned-off state. Particularly, both the memory cell MCN closest to the drain select transistor DST and the memory cell MC1 closest to the source select transistor SST, which are turned on or off based on the fifth voltage PV5 having a value lower than or equal to 2.3V, may be in a turned-off state at the initial stage of the fourth operation $2^{ND}$ DSC.

In this way, since both the drain select transistor DST and the source select transistor SST are in a turned-off state in the fourth operation $2^{ND}$ DSC in which the levels of all of the word lines ALL WLs fall from 2.3V to the ground voltage (VSS) level 0V, the voltage level of the channel should fall to −2V lower than the ground voltage (VSS) level 0V. However, due to the memory cell MCN closest to the drain select transistor DST and the memory cell MC1 closest to the source select transistor SST which have been turned off at the initial stage of the fourth operation $2^{ND}$ DSC, the voltage level of the channel between the memory cell MCN closest to the drain select transistor DST and the memory cell MC1 closest to the source select transistor SST may fall to −2.3V which is lower than −2V.

In the fourth operation $2^{ND}$ DSC of the second section operation $2^{ND}$ SECTION illustrated in FIG. 6, the voltage level of the channel falls to −2.3V, but the voltage drop width is smaller than the case where the voltage level of the channel falls to −4V in the state 'C' of the second operation $1^{ST}$ DSC illustrated in FIG. 5. Accordingly, when the second section operation $2^{ND}$ SECTION illustrated in FIG. 6 is performed after the state 'C' of the second operation $1^{ST}$ DSC illustrated in FIG. 5, the threshold voltage of the memory cells MC1 to MCN may appropriately fall. That is, the state in which the threshold voltage of the memory cells MC1 to MCN excessively falls in the first section operation $1^{ST}$ SECTION illustrated in FIG. 5 may be changed to the state in which the threshold voltage of the memory cells MC1 to MCN appropriately falls in the second section operation $2^{ND}$ SECTION illustrated in FIG. 6.

Referring to FIG. 1 to FIG. 7, the level of the highest seventh voltage PV7, among the first to seventh voltage (PV1 to PV7) levels used to determine the data of the plurality of memory cells MC1 to MCN included in the memory block selected as the target for the read refresh operation, is higher than 2.3V. Furthermore, the threshold voltage level DSL Vt of the drain select transistor DST and the threshold voltage level SSL Vt of the source select transistor SST which are included in the memory block selected as the target for the read refresh operation, are equal to or less than 2V. Furthermore, the third voltage level V2 is 2.3V. Furthermore, the dummy memory cells DDC and SDC existing between the plurality of memory cells MC1 to MCN and the drain select transistor DST/the source select transistor SST are all in an erase state E.

In the third operation $2^{ND}$ DRV of the second section operation $2^{ND}$ SECTION, each of the drain select line DSL and the source select line SSL included in the memory block selected as the target for the read refresh operation is at the turn-on voltage level TON, and the turn-on voltage level TON may be a level higher than 2V. Accordingly, the drain select transistor DST and the source select transistor SST may be in a turned-on state.

In the third operation $2^{ND}$ DRV, the levels of all of the word lines ALL WLs included in the memory block selected as the target for the read refresh operation may rise from the ground voltage (VSS) level to 2.3V which is the third voltage level V2. In this way, in the third operation $2^{ND}$ DRV, almost half of the memory cells MC1 to MCN included in all of the word lines ALL WLs may be in a turned-on state. Particularly, both the memory cell MCN closest to the drain select transistor DST and the memory cell MC1 closest to the source select transistor SST, which are turned on or off based on the seventh voltage PV7 having a value higher than 2.3V, may be in a turned-off state. Since the drain select transistor DST and the source select transistor SST are in a turned-on state, the channel should substantially maintain the ground voltage (VSS) level 0V. However, since both the memory cell MCN closest to the drain select transistor DST and the memory cell MC1 closest to the source select transistor SST are in a turned-off state, the voltage level of the channel between the memory cell MCN closest to the drain select transistor DST and the memory cell MC1 closest to the source select transistor SST may rise to 2.3V in response to the levels of all of the word lines ALL WLs which rise from the ground voltage (VSS) level 0V to 2.3V which is the third voltage level V2.

In the fourth operation $2^{ND}$ DSC of the second section operation $2^{ND}$ SECTION, each of the drain select line DSL and the source select line SSL included in the memory block selected as the target for the read refresh operation is at the turn-off voltage level TOFF, and the turn-off voltage level TOFF may be the ground voltage (VSS) level 0V. Accordingly, in the fourth operation $2^{ND}$ DSC, the drain select transistor DST and the source select transistor SST may be in a turned-off state.

The levels of all of the word lines ALL WLs having risen to 2.3V, which is the third voltage level V2, in the third operation $2^{ND}$ DRV may fall to the ground voltage (VSS) level 0V in the fourth operation $2^{ND}$ DSC.

In this way, in the process in which the fourth operation $2^{ND}$ DSC is performed after the third operation $2^{ND}$ DRV, most of the memory cells MC1 to MCN included in all of the word lines ALL WLs may be in a turned-off state. Particularly, both the memory cell MCN closest to the drain select transistor DST and the memory cell MC1 closest to the source select transistor SST, which are turned on or off based on the seventh voltage PV7 having a value higher than 2.3V, may continuously maintain a turned-off state even in the fourth operation $2^{ND}$ DSC subsequent to the third operation $2^{ND}$ DRV.

In this way, since both the drain select transistor DST and the source select transistor SST are in a turned-off state in the fourth operation $2^{ND}$ DSC in which the levels of all of the word lines ALL WLs fall from 2.3V to the ground voltage (VSS) level 0V, the voltage level of the channel should fall to −2V lower than the ground voltage (VSS) level 0V. However, the voltage level of the channel between the memory cell MCN closest to the drain select transistor DST and the memory cell MC1 closest to the source select transistor SST has risen to 2.3V in the third operation $2^{ND}$ DRV. Thus, the channel between the memory cell MCN closest to the drain select transistor DST and the memory cell MC1 closest to the source select transistor SST may have the ground voltage (VSS) level 0V.

The channel substantially maintains the ground voltage (VSS) level 0V in the fourth operation $2^{ND}$ DSC of the second section operation $2^{ND}$ SECTION illustrated in FIG. 7. Thus, when the second section operation $2^{ND}$ SECTION illustrated in FIG. 6 is performed after the state 'C' of the second operation $1^{ST}$ DSC illustrated in FIG. 5, the threshold voltage of the memory cells MC1 to MCN may appropriately fall. That is, the state in which the threshold voltage of the memory cells MC1 to MCN excessively falls in the first section operation $1^{ST}$ SECTION illustrated in FIG. 5 may be changed to the state in which the threshold voltage of the memory cells MC1 to MCN appropriately falls in the second section operation $2^{ND}$ SECTION illustrated in FIG. 6.

The present disclosure described above is not limited by the aforementioned embodiments and the accompanying drawings, and it should be apparent to those skilled in the art to which the present disclosure pertains, that various substitutions, modifications, and changes can be made without departing from the technical spirit of the present disclosure and the following claims.

For example, the position and the type of a logic gate and a transistor illustrated in the aforementioned embodiments should be differentially realized according to the polarity of an inputted signal. Furthermore, the embodiments may be combined to form additional embodiments.

What is claimed is:

1. A memory system comprising:

a nonvolatile memory device including a plurality of memory blocks each including a plurality of memory cells coupled to a plurality of word lines; and a controller configured to control the nonvolatile memory device to perform a read refresh operation on the plurality of memory blocks, wherein the read refresh operation includes:

a first operation of driving a first voltage level to each of the plurality of word lines, a second operation of discharging each of the plurality of word lines to a second voltage level, a third operation of driving a third voltage level less than the first voltage level to each of the plurality of word lines, and a fourth operation of discharging each of the plurality of word lines to a fourth voltage level, wherein the first voltage level is a level higher by a set level than a voltage level for turning on a memory cell with a highest threshold voltage level among the plurality of memory cells, and wherein the third voltage level is a level for turning on some of the plurality of memory cells and turning off the others.

2. The memory system of claim 1, wherein each of the second voltage level and the fourth voltage level are a ground voltage level.

3. The memory system of claim 1, wherein each of the plurality of memory blocks further includes a first select line and a second select line, the plurality of word lines being arranged between the first select line and the second select line, and wherein the read refresh operation further includes:

substantially maintaining the first and second select lines to a turn-on voltage level during the first operation or the third operation, substantially maintaining the first and second select lines to one of the turn-on voltage level and a turn-off voltage level during the second operation, and substantially maintaining the first and second select lines to the turn-off voltage level during the fourth operation.

4. The memory system of claim 1, wherein the controller is further configured to determine when to start the read refresh operation on the basis of a number of accesses to the plurality of memory blocks.

5. The memory system of claim 4, wherein the controller is further configured to select, as a target memory block for the read refresh operation, one of the memory blocks based on timings of most recent accesses to the memory blocks.

6. The memory system of claim 1, wherein the plurality of memory blocks are divided into first and second block groups, within each of which the memory blocks share a bit line, and wherein the controller is further configured to determine:

when to start the read refresh operation on a memory block within the first block group on the basis of a number of accesses to the first block group, and when to start the read refresh operation on a memory block within the second block group on the basis of a number of accesses to the second block group.

7. The memory system of claim 6, wherein the controller is further configured to select, as a target memory block for the read refresh operation, a memory block within the first block group based on timings of most recent accesses to the memory blocks within the first block group, and wherein the controller is further configured to select, as a target memory block for the read refresh operation, a memory block within the second block group based on timings of most recent accesses to the memory blocks within the second block group.

8. A nonvolatile memory device comprising:

a plurality of memory blocks each including a plurality of memory cells coupled to a plurality of word lines; and a control circuit configured to perform a read refresh operation on a selected memory block among the plurality of memory blocks, wherein the read refresh operation includes:

a first operation of driving a first voltage level to each of the plurality of word lines, a second operation of discharging each of the plurality of word lines to a second voltage level, a third operation of driving a third voltage level less than the first voltage level to each of the plurality of word lines, and a fourth operation of discharging each of the plurality of word lines to a fourth voltage level, wherein the first voltage level is a level higher by a set level than a voltage level for turning on a memory cell with a highest threshold voltage level among the plurality of memory cells, and wherein the third voltage level is a level for turning on some of the plurality of memory cells and turning off the others.

9. The nonvolatile memory device of claim 8, wherein each of the second voltage level and the fourth voltage level is a ground voltage level.

10. The nonvolatile memory device of claim 8, wherein each of the plurality of memory blocks further includes a first select line and a second select line, the plurality of word lines being arranged between the first select line and the second select line, and wherein the read refresh operation further includes:

substantially maintaining the first and second select lines to a turn-on voltage level during the first operation or the third operation, substantially maintaining the first and second select lines to one of the turn-on voltage level and a turn-off voltage level during the second operation, and substantially maintaining the first and second select lines to the turn-off voltage level during the fourth operation.

11. An operating method of a nonvolatile memory device including a plurality of memory blocks each including a plurality of memory cells coupled to a plurality of word lines, the operating method comprising:

selecting at least one of the plurality of memory blocks as a selected memory block; and performing a read refresh operation on the selected memory block, wherein the read refresh operation includes:

a first operation of driving a first voltage level to each of the plurality of word lines, a second operation of discharging, after the first operation, each of the plurality of word lines to a second voltage level, a third operation of driving, after the second operation, a third voltage level less than the first voltage level to each of the plurality of word lines, and a fourth operation of discharging, after the third operation, each of the plurality of word lines to a fourth voltage level, wherein the first voltage level is a level higher by a set level than a voltage level for turning on a memory cell with a highest threshold voltage level among the plurality of memory cells, and wherein the third voltage level is a level for turning on some of the plurality of memory cells and turning off the others.

12. The operating method of claim 11, wherein each of the second voltage level and the fourth voltage level is a ground voltage level.

13. The operating method of claim 11, wherein each of the plurality of memory blocks further includes a first select line and a second select line, the plurality of word lines being arranged between the first select line and the second select line, and wherein the read refresh operation further includes:

substantially maintaining the first and second select lines to a turn-on voltage level during the first operation or the third operation, substantially maintaining the first and second select lines to one of the turn-on voltage level and a turn-off voltage level during the second operation, and substantially maintaining the first and second select lines to the turn-off voltage level during the fourth operation.

* * * * *